United States Patent
Schlage et al.

(10) Patent No.: US 9,928,860 B2
(45) Date of Patent: Mar. 27, 2018

(54) METHOD OF PRODUCING A MULTI-LAYER MAGNETOELECTRONIC DEVICE AND MAGNETOELECTRONIC DEVICE

(71) Applicant: Deutsches Elektronen-Synchrotron DESY, Hamburg (DE)

(72) Inventors: Kai Schlage, Schenefeld (DE); Denise Erb, Hamburg (DE); Ralf Röhlsberger, Jesteburg (DE); Hans-Christian Wille, Rellingen (DE); Daniel Schumacher, Ellerbek (DE); Lars Bocklage, Hamburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 153 days.

(21) Appl. No.: 14/475,800

(22) Filed: Sep. 3, 2014

(65) Prior Publication Data
US 2015/0064499 A1    Mar. 5, 2015

(30) Foreign Application Priority Data
Sep. 5, 2013    (EP) .................................... 13183166

(51) Int. Cl.
G11B 5/39    (2006.01)
G11B 5/85    (2006.01)
(Continued)

(52) U.S. Cl.
CPC .............. G11B 5/3906 (2013.01); G11B 5/85 (2013.01); H01F 10/324 (2013.01);
(Continued)

(58) Field of Classification Search
CPC . G11B 5/3906; G11B 5/85; G11B 2005/3996; H01F 10/324; H01F 41/302; Y10T 428/1129
(Continued)

(56) References Cited

U.S. PATENT DOCUMENTS 6,818,961 B1    11/2004    Rizzo et al.
2001/0028539 A1*    10/2001    Kikuiri ................. B82Y 10/00
                                                              360/320

FOREIGN PATENT DOCUMENTS

DE            10128262 A1    12/2002
WO    WO-2006/034673 A1    4/2006
WO    WO-2012/035355 A2    3/2012

OTHER PUBLICATIONS

R. Rohlsberger et al.; "A Deep Look Into Exchange-Coupled Films: Advances Through Nuclear Resonant Scattering of Synchrotron Radiation"; Journal of magnetism and Magnetic Materials, Elsevier Science Publishers, NL, vol. 282, Nov. 1, 2004, pp. 329-333, XP027150799, ISSN 0304-8853.

(Continued)

Primary Examiner — Rodney McDonald
(74) Attorney, Agent, or Firm — Harness, Dickey & Pierce, P.L.C.

(57) ABSTRACT

A method of producing a multilayer magnetoelectronic device and a related device. The method includes depositing a multilayer structure including at least two ferromagnetic layers disposed one on top of the other and each having a magnetic anisotropy with a corresponding magnetic moment. A magnetization curve is specified for the magnetoelectronic device. The number of ferromagnetic layers and, for each of the ferromagnetic layers, the magnetic moment and the magnetic hardness for obtaining the specified magnetization curve are determined. For each of the ferromagnetic layers a magnetic material, a thickness, an azimuthal angle and an angle of incidence are determined for obtaining the determined magnetic moment and magnetic hardness of the respective ferromagnetic layer. The multilayer structure is deposited using the determined material, thickness, azimuthal angle and angle of incidence for each of the ferromagnetic layers.

13 Claims, 9 Drawing Sheets

(51) Int. Cl.
 H01F 10/32 (2006.01)
 H01F 41/30 (2006.01)
 H01L 43/12 (2006.01)
(52) U.S. Cl.
 CPC ........... *H01F 41/302* (2013.01); *H01L 43/12* (2013.01); *G11B 2005/3996* (2013.01); *Y10T 428/1129* (2015.01)
(58) Field of Classification Search
 USPC ...................................................... 204/192.2
 See application file for complete search history.

(56) References Cited

OTHER PUBLICATIONS

Kai Schlage et al.; "Nuclear Resonant Scattering of Synchrotron Radiation: Applications in Magnetism of Layered Structures"; Journal of Electron Spectroscopy and Related Phenomena, vol. 189, Aug. 1, 2013, pp. 187-195, XP055096816, ISSN 0368-2048, DOI 10.1016/j.espec.2013.02.005.

S. Couet et al.; "Probing the Magnetic State of FE/FEO/Fe Trilayers by Multiple Isotopic Sensor Layers"; Applied Physics Letters, American Institute of Physics, US, vol. 94, No. 16, Apr. 20, 2009, pp. 162501-162501, XP012120964, ISSN 0003-6951, DOI 10.1063/1.3120770.

\* cited by examiner

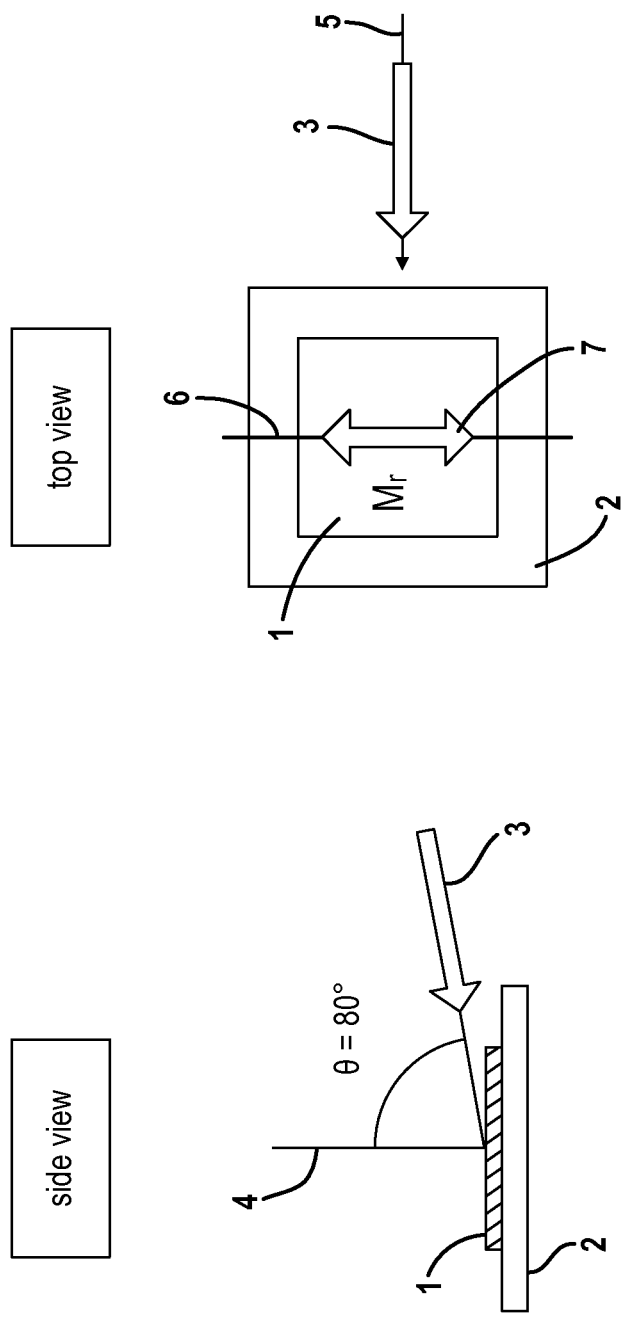

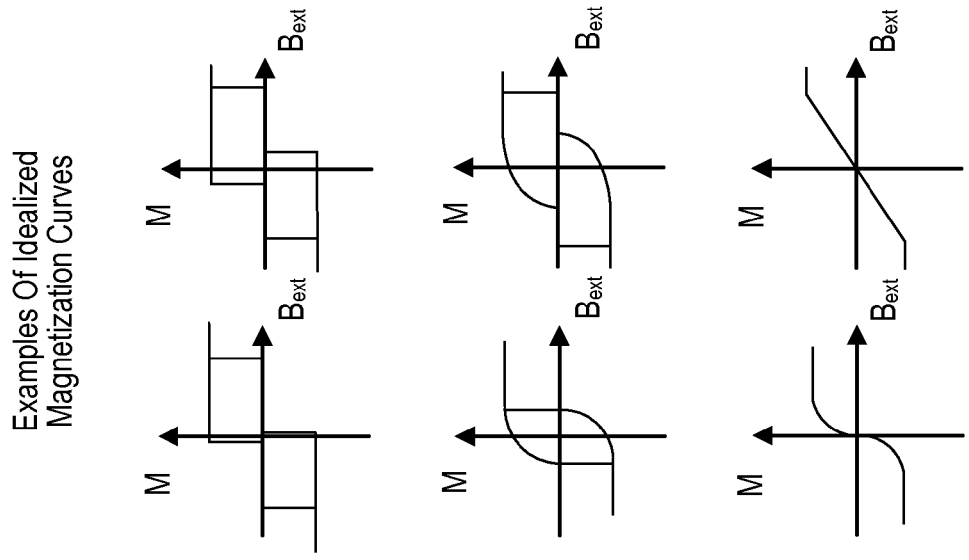
FIG. 6C
FIG. 6B
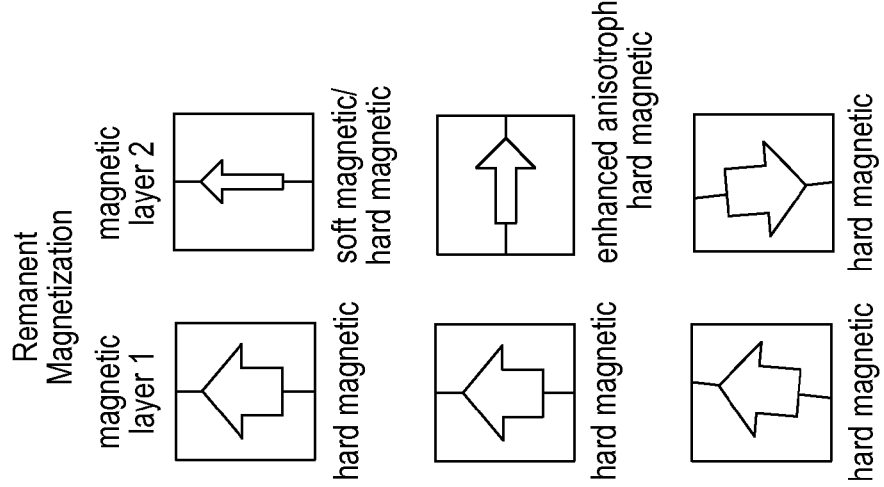
FIG. 6A

METHOD OF PRODUCING A MULTI-LAYER MAGNETOELECTRONIC DEVICE AND MAGNETOELECTRONIC DEVICE

CROSS-REFERENCE TO RELATED APPLICATIONS

This application claims the benefit and priority of European Patent Application No. 13183166.1, filed Sep. 5, 2013, the disclosure of which is incorporated by reference as if fully set forth in detail herein.

FIELD

The present disclosure relates to a method of producing a multilayer magnetoelectronic device and a related magnetoelectric device.

BACKGROUND

This section provides background information related to the present disclosure which is not necessarily prior art.

Multilayer magnetoelectronic devices rely on the property of particular multilayer structures, which include ferromagnetic layers separated by intermediate nonmagnetic layers, that their electric resistance changes upon application of an external magnetic field. More particularly, this so-called magnetoresistance is due to the fact that the electric resistance depends on the relative orientation of the magnetization of the individual ferromagnetic layers, and that an external magnetic field may change this relative orientation. Two effects resulting in magnetoresistance are the so-called giant magnetoresistance (GMR) effect, which may occur in multilayer structures in which the intermediate nonmagnetic layers are electric conductors, and the tunnel magnetoresistance (TMR) effect, which may occur in multilayer structures in which the intermediate nonmagnetic layers are electric insulators.

In order to be useful in practice, magnetoresistive multilayer structures must be manufactured with a defined relative orientation of the magnetization of the individual layers, i.e. of their magnetic moments which are vectorial quantities. For this reason, many of the known magnetoresistive multilayer structures are rather complex and difficult to prepare. In prior art magnetoresistive multilayer structures the orientation of the magnetization of adjacent ferromagnetic layers differs by 0° or 180°. Further, in laboratory experiments multilayer structures in which the orientation of the magnetization of adjacent ferromagnetic layers differs by 90° have been created, but turned out to be very difficult to produce reliably and have not be utilized in actual magnetoelectronic devices.

For example, in one type of magnetoresistive multilayer structure the materials and thicknesses of the ferromagnetic layers and the intermediate nonmagnetic layers are carefully chosen and controlled such that adjacent ferromagnetic layers are coupled by the so-called RKKY interaction, which effects a relative orientation of the magnetic moments of the respective two ferromagnetic layers. The RKKY interaction varies with, amongst others, the thickness of the intermediate nonmagnetic layer, so that the orientation of the magnetization of adjacent ferromagnetic layers can be chosen to be either parallel or antiparallel in remanence (the above-mentioned relative orientations of 90° are very difficult to realize in a stable manner). A suitable external magnetic field is able to overcome the coupling strength of the RKKY interaction and to change the direction of the magnetization of at least some of the ferromagnetic layers, thereby changing the electric resistance of the multilayer structure. For example, the orientation may be forced to change from antiparallel in remanence to parallel upon application of the external magnetic field. The resulting change of the magnetoresistance of the multilayer structure can be used to detect the presence of the external magnetic field.

Due to the fact that in practice it is only possible reliably to realize parallel or antiparallel relative orientations and that the strength of the interlayer coupling provided by the RKKY interaction, which strength influences the saturation behavior of the coupled ferromagnetic layers in an extremely sensitive manner and changes upon varying the thickness of the intermediate layer in the order of 0.1 nm, the possibilities to selectively precisely set the switching field and the general magnetic field dependence of the magnetoresistance are very limited. Consequently, the design of corresponding magnetic field sensors adapted to particular applications is restricted. Further, the RKKY interaction is only observed for a very limited number of material combinations for the ferromagnetic layers and the intermediate layers and for very thin intermediate layers.

A further example for magnetoresistive multilayer structures are so-called exchange-biased spin valves, in which an antiferromagnetic layer is arranged in contact with one ferromagnetic layer in order to fix or "pin" the magnetization of that ferromagnetic layer by means of an exchange interaction. A further ferromagnetic layer is separated and decoupled from the fixed ferromagnetic layer by a nonmagnetic intermediate layer. Consequently, this "free" ferromagnetic layer may change its magnetization upon application of a suitable external magnetic field while maintaining the magnetization of the fixed layer. Spin valve systems can be classified depending on the electric properties of the nonmagnetic intermediate layer. So-called GMR type spin valves utilize electrically conductive intermediate layers, and so-called TMR (tunnel magnetoresistance) type spin valves utilize electrically insulating intermediate layers, which act as tunnel barriers. TMR spin valves are used, for example, in magnetoresistive random access memory (MRAM) devices. In order to reduce or avoid stray fields generated by the pinned layer and an undesired coupling between the pinned layer and the free layer, a combination of two antiparallel ferromagnetic layers may be used as pinned layer instead of a single pinned ferromagnetic layer. Such a pinned combined layer may be arranged such that its overall magnetic field is zero or near zero at the free layer. This construction of the pinned layer is commonly utilized in, for example, MRAM devices.

The antiferromagnetic layer in these spin valves is part of a rather complex pinning structure, which complicates the manufacturing of such spin valve structures. Additionally, also in this case the possibilities to selectively precisely set the switching field and the general magnetic field dependence of the magnetoresistance are very limited, because the switching behavior of the free magnetic layer can hardly be influenced and no easy magnetic axis, i.e. no preferred direction for the magnetic moment, is typically induced in the free layer.

In any case, it is problematic to reliably prepare ferromagnetic layers having a defined magnetic anisotropy in the multilayer structures. In this regard, only the above-mentioned relative orientations of 0° and 180° (and 90° in laboratory experiments) were realized.

From U.S. Pat. No. 6,818,961 it is known to prepare the ferromagnetic layers of magnetoresistive multilayer structures by oblique incidence deposition, wherein depending on the angle between the incident particles being deposited and the direction perpendicular to the plane of extension of the ferromagnetic layers the easy axis of the resulting uniaxial anisotropy is either parallel or perpendicular to the plane defined by the direction of incidence of the particles and the projection of that direction onto the plane of extension of the ferromagnetic layers. According to this prior art document, smaller angles result in a parallel orientation of the easy axis and larger angles result in a perpendicular orientation of the easy axis, and by varying the angle of incidence it is furthermore possible to vary the magnetic hardness of the layers. The technique was used to prepare multilayer structures having parallel relative orientations of the magnetization of the ferromagnetic layers.

Irrespective of the type of magnetoresistive multilayer structure used known methods of producing multilayer magnetoelectronic devices provide only a limited capability to adapt them to a particular application. This also entails that for some applications multilayer magnetoelectronic devices are merely of limited usefulness or cannot be used altogether. For example, if at all possible, it is very complicated to provide a multilayer magnetoelectronic device having a defined and desired qualitative or quantitative sensitivity for a particular application.

SUMMARY

This section provides a general summary of the disclosure, and is not a comprehensive disclosure of its full scope or all of its features.

It is an object of the present disclosure to provide a method of producing multilayer magnetoelectronic devices which increases their flexibility and the possibility to adapt them to particular applications and which extends their usefulness to new applications.

In one form, the present disclosure provides a method of producing a multilayer magnetoelectronic device, such as, in particular, a magnetic field sensor or an MRAM device, comprises depositing a multilayer structure including or consisting of two or more ferromagnetic layers disposed one on top of the other on a substrate. Each of the ferromagnetic layers is deposited in such a manner that it is magnetically anisotropic, i.e. that it exhibits a magnetic moment having a magnitude and a direction. In practice, the direction of the magnetic moment is extending in the plane defined by the respective ferromagnetic layer.

Further, the multilayer structure is deposited such that each two adjacent ferromagnetic layers of the ferromagnetic layers are separated by a respective nonmagnetic layer. Depending on whether a multilayer structure relying on the GMR effect or on the TMR effect is to be produced, the nonmagnetic layers are electrically conductive or electrical insulators.

The magnetic anisotropy is created in part or entirely by oblique incidence deposition of the respective ferromagnetic layers, i.e. each of the respective ferromagnetic layers is deposited at a respective azimuthal angle and at a respective angle of incidence of the particles being deposited, wherein the azimuthal angle and the angle of incidence are chosen to create the desired uniaxial magnetic anisotropy. In this regard, in the usual manner the azimuthal angle is the angle between the projection of the path of the particles being deposited onto the plane of the respective ferromagnetic layer and a reference direction extending in the plane of the respective ferromagnetic layer. The reference angle is the same for all layers of a particular magnetoelectronic device, but otherwise can be chosen and determined arbitrarily.

Likewise in the usual manner the angle of incidence is the angle between the path of the particles being deposited and a direction perpendicular to the plane of the respective ferromagnetic layer. As known from U.S. Pat. No. 6,818,961 the direction of the easy axis of the magnetization of each of the respective ferromagnetic layers can be determined by suitably choosing the azimuthal angle and a nonzero angle of incidence. In order to define a particular direction of magnetization along the axis defined by the uniaxial anisotropy, a relatively small suitable external magnetic field may be applied during deposition of the ferromagnetic layers. It is to be noted that the multilayer structure may only include the above ferromagnetic layer or may also include other ferromagnetic layers produced in a different way, for example by zero angle deposition.

The inventors of the present invention have recognized that by individually choosing the thicknesses, the azimuthal angles and the angles of incidence for the multiple ferromagnetic layers it is possible to flexibly and easily provide the multilayer structure with desired and defined magnetic hardnesses and relative orientations of the magnetization of the ferromagnetic layers, and to thereby flexibly adapt the multilayer structure and the magnetoelectronic device to particular applications. In particular, it is possible to easily, reliably and in a stable manner generate any desired relative orientations of the magnetizations of adjacent ferromagnetic layers different from the parallel and antiparallel configuration.

Accordingly, a method in accordance with the teachings of the present disclosure can comprise specifying a magnetization curve for the magnetoelectronic device. Due to the fact that the magnetization curve determines the switching field and the field dependent switching behavior, such as in particular the sensitivity, this step preferably comprises specifying the switching field and the switching behavior and then determining a corresponding magnetization curve. It is to be noted in this regard that the magnetization curve also determines the magnetoresistance curve for the magnetoelectronic device, i.e. a particular characteristic of the magnetoresistive property of the device as a whole. In this context the magnetization is measured integrally over the entire multilayer structure. As to the measurement of the resistance, it may be the resistance in the plane defined by the individual layers or perpendicularly to that plane, i.e. perpendicular to the layer structure.

It is noted that the performance of the magnetoelectronic device can only be determined with highly specialized equipment for detecting the overall field dependent change of the magnetoresistance and the signal to noise ratio. However, the field dependent magnetoresistance characteristics and the sensitivity of the device can be directly concluded from conventional magnetic hysteresis curves, because the magnetic switching embodied in a change in the hysteresis curve is accompanied by a corresponding change in the magnetoresistance. Therefore, magnetic hysteresis curves detected via techniques such as, e.g., SQUID or MOKE can be used to reveal the field dependent sensitivity of the magnetoelectronic device.

Then, a number of ferromagnetic layers and, for each of the ferromagnetic layers, a magnetic moment and a magnetic hardness (i.e., the coercive force) are determined in such a manner that the resulting multilayer structure exhibits the specified magnetization curve. Due to the additive contribution of the individual layers to the magnetization curve, this determination can be easily effected by, e.g., conventional simulations or also by using deterministic approaches.

Subsequently, for each of the ferromagnetic layers a magnetic material, a thickness, an azimuthal angle and an angle of incidence are determined in such a manner that the determined magnetic moment and magnetic hardness of the respective ferromagnetic layer is obtained. This determination can be easily effected in a deterministic manner based on the known dependence of the magnetic moment and magnetic hardness on the parameters thickness, azimuthal angle and angle of incidence. The dependence can be determined for each possible material by way of experiment. This step may optionally further include determining for each ferromagnetic layer whether a seed layer should be arranged directly adjacent the corresponding ferromagnetic layer and the properties of such an optional feed layer. A seed layer may be, for example, arranged directly between and in contact with a ferromagnetic layer and a substrate onto which the multilayer structure is deposited, such as preferably a chemically inert, nonmagnetic substrate. Such seed layers are capable of influencing the crystalline structure and lateral surface profile of the respective deposited ferromagnetic layer, thus influencing the magnetic anisotropy and magnetic hardness of the ferromagnetic layer, and it may be easier to obtain particular characteristics together with a seed layer as compared to varying the thickness, azimuthal angle and angle of incidence alone. It is to be noted that, as mentioned above, while it is preferred that all ferromagnetic layers are deposited using a non-zero angle of incidence, it is also possible that for some ferromagnetic layers zero angle incidence deposition is used.

Finally, the deposition of the multilayer structure is carried out using the determined material, thickness, azimuthal angle and angle of incidence—and possibly the determined seed layer—for each of the ferromagnetic layers.

By variably selecting and adjusting the magnetic hardness and the magnetic moment of the ferromagnetic layers, multilayer structures having very different magnetoresistance curves can be realized. For example, it is possible to selectively adjust the slope of the magnetoresistance curve in a particular range of external magnetic field strength in order to allow for precise quantitative measurement in that range. Further, the multilayer structures are of low complexity, because the magnetic properties of the ferromagnetic layers do not rely on magnetic coupling between the layers or on pinning. Thus, for example, the multilayer structure may be deposited directly onto a nonmagnetic substrate. Due to the selective hardmagnetic construction of the ferromagnetic layer adjacent to the substrate, no antiferromagnetic pinning layer is required inbetween. Moreover, the thickness and material composition of the nonmagnetic layers is much less critical than in the prior art, because the magnetic properties of the ferromagnetic layers are defined by each ferromagnetic layer by itself. Thus, the present invention advantageously drastically extends the possibilities to selectively and precisely tune the magnetoresistive characteristics of the multilayer structures.

In one form, for one, more than one or all of the ferromagnetic layers the angle of incidence is greater than 45°, preferably greater than 70°, more preferably greater than 80° and most preferably greater than 85°. It has been found that, advantageously, the magnetic hardness increases rapidly for angles of incidence greater than 70°, in particular for angles of incidence greater than 80°.

In another form, for each of the ferromagnetic layers the angle of incidence is chosen such that the respective ferromagnetic layer exhibits uniaxial magnetic anisotropy with the easy axis oriented perpendicularly with respect to a plane spanned by the path of the particles being deposited and the projection of this path onto the plane defined by the respective ferromagnetic layer. Angles resulting in such perpendicular orientation generally also exhibit higher magnetic hardness than angles resulting in a parallel orientation.

In still another form, for each two adjacent ferromagnetic layers of the ferromagnetic layers the azimuthal angles are different, such that the resulting magnetic moments have different directions. In particular, for at least two adjacent ferromagnetic layers of the ferromagnetic layers the difference in the azimuthal angles is between 1° and 179°, preferable between 1° and 89° or between 91° and 179°, i.e. use is made of the possibility to easily provide relative orientations which are not parallel, antiparallel or perpendicular, thereby greatly enhancing the flexibility and the adaptability of the production of magnetoelectronic devices.

Generally, for each of the ferromagnetic layers any alloy may be used containing elements that order ferromagnetically in the alloy such that an effective magnetic moment of the corresponding layer results. The material selected for the ferromagnetic layer is then constituted or comprises such elements. In a preferred embodiment, for each of the ferromagnetic layers the magnetic material is chosen from the group consisting of Fe, Co, Ni and thermodynamically stable alloys thereof. In this regard it is to be noted that each ferromagnetic layer may also comprise other materials in addition to the magnetic material. Thus, in this embodiment any alloy containing sufficient proportions of Fe, Co and/or Ni in order for the alloy to exhibit ferromagnetic properties may be used. Such other materials may be present, for example, in an amount of up to 50% by weight or even 70% by weight.

In yet another form, each two adjacent ferromagnetic layers have the same material composition or each two adjacent ferromagnetic layers have different material compositions. In this regard, use is made of the possibility and flexibility to easily choose different magnetic materials (and possible other materials), thereby greatly enhancing the flexibility and the adaptability of the production of magnetoelectronic devices.

In a further form, for each of the nonmagnetic layers a material and a thickness is further determined, and the multilayer structure is then deposited using the determined material and thickness for each of the nonmagnetic layers. These parameters determine various characteristics, such as the electrical resistance, the conservation of the spin polarization of the electrons and a possible undesired coupling between adjacent ferromagnetic layers via stray fields, so that a suitable choice of these parameters further extends and facilitates tuning of the magnetoresistive properties.

In still another form, the deposition of the ferromagnetic layers and/or the deposition of the nonmagnetic layers is carried out by means of ion beam deposition or physical vapor deposition, such as, e.g., sputtering. Preferably, for sputter deposited layers a low working gas pressure and a mask system is used helping to increase the uniformity of the direction of incidence of the deposited particles and, thus, the quality of the deposited layers.

In yet another form, the multilayer structure is deposited onto a chemically inert, nonmagnetic substrate. It may be deposited directly onto the substrate, or, e.g., a seed layer may be arranged between the substrate and the multilayer structure such that it is in contact with both the substrate and one of the ferromagnetic layers. In this connection it is noted that, as already mentioned above, a respective seed layer may also be arranged directly adjacent one or more of the ferromagnetic layers remote from the substrate. As also already indicated above, such seed layers, such as, e.g., tantalum layers, can help to modify the crystalline structure and surface roughness of the deposited layers and to thereby influence the magnetoresistance of the overall system.

As already explained in detail above, the above method can be advantageously utilized to produce a magnetoelectronic device comprising a multilayer structure including at least two ferromagnetic layers disposed one on top of the other and each having a magnetic anisotropy with a corresponding magnetic moment, wherein each two adjacent ferromagnetic layers of the at least two ferromagnetic layers are separated by a respective nonmagnetic layer and exhibit uniaxial magnetic anisotropy with the easy axes oriented in different directions. For at least two and preferably for all adjacent ones of the at least two ferromagnetic layers the relative orientation of the easy axes is different from anti-parallel. Preferably, for each respective pair of adjacent ferromagnetic layers the relative orientation is between 1° and 179°, preferable between 1° and 89° or between 91° and 179°. A device having such relative orientations or the magnetization of adjacent ferromagnetic layers exhibits magnetoresistive properties not found in prior art devices, and for any possible particular application a device can be found which satisfies the requirements of this application, such as a particular switching field and a particular field dependent sensitivity.

In another form, the multilayer structure of the magnetoelectronic device is deposited directly onto or arranged directly on a chemically inert, nonmagnetic substrate such that one of the ferromagnetic layers of the multilayer structure is in contact with the substrate. Such a magnetoelectronic device is of a particularly simple construction. In the alternative, a seed layer may be disposed directly between the substrate and one of the ferromagnetic layers such that it is in contact with both of them.

In still another form the magnetoelectronic device is a magnetic field sensor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A shows schematic side and top views of an inert substrate onto which a ferromagnetic iron layer is deposited by oblique incidence sputter deposition.

Figure 4:
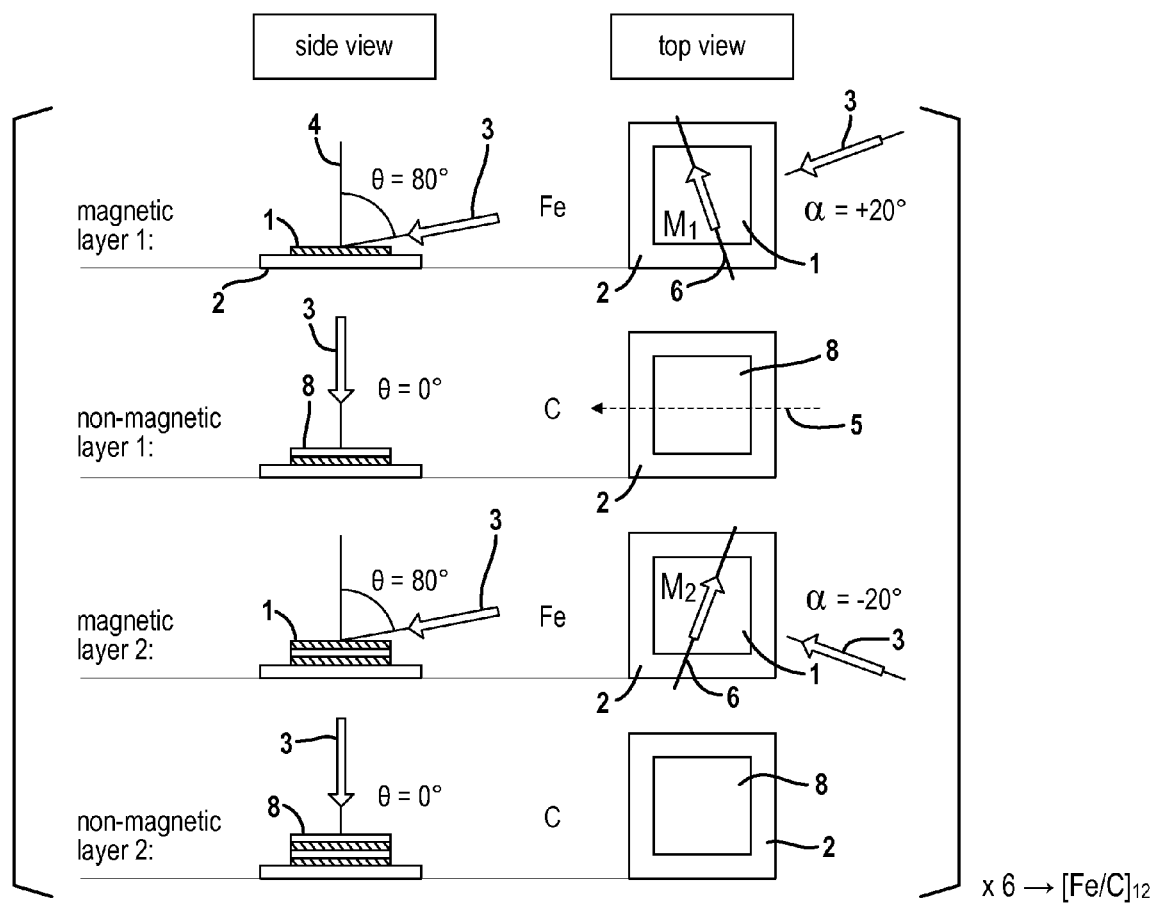

FIG. 4 schematically illustrates a process in which a multilayer structure comprising multiple ferromagnetic iron layers separated by non-magnetic intermediate layers is deposited onto an inert substrate.

Figure 5A:
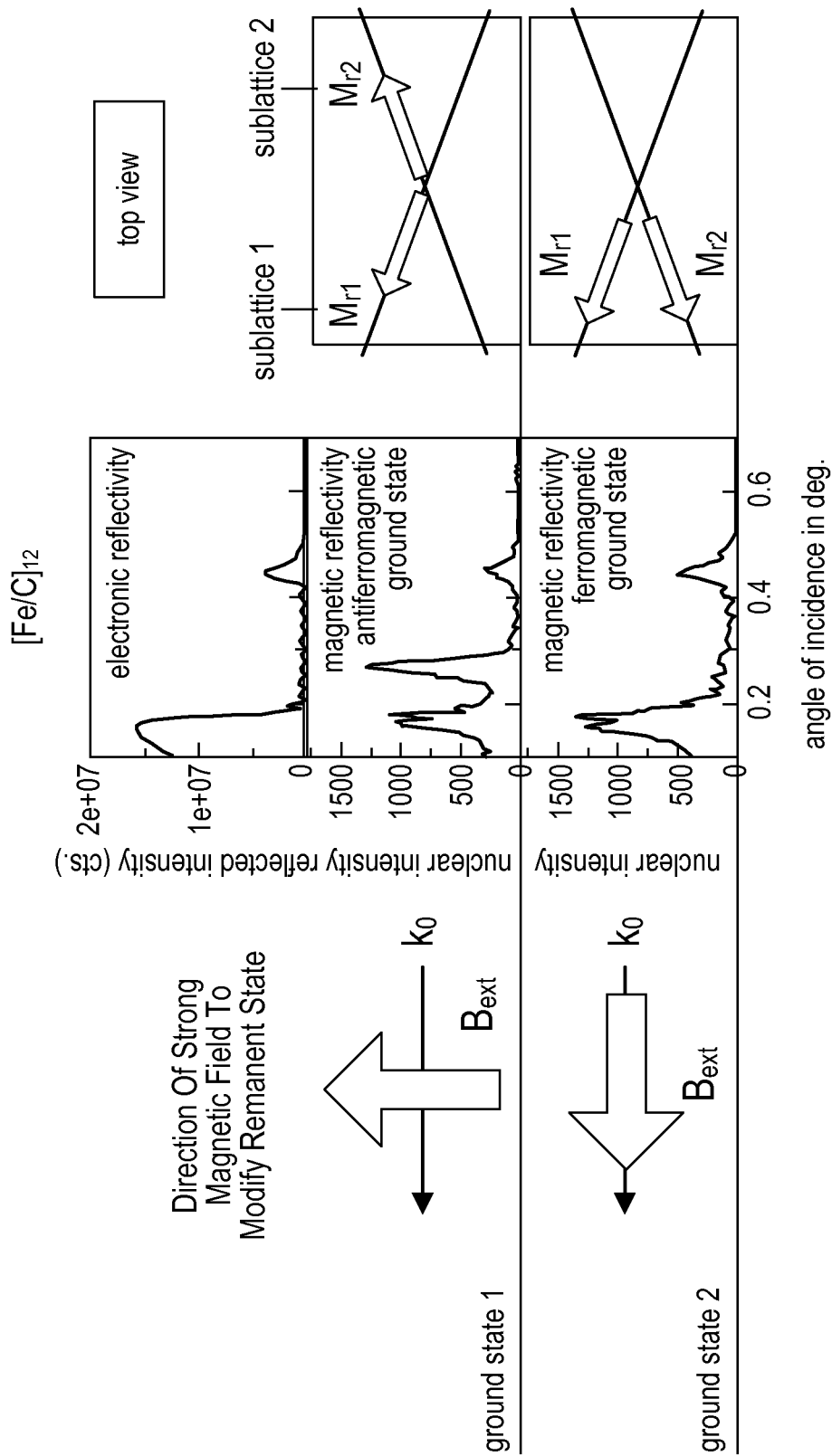
Figure 7A:
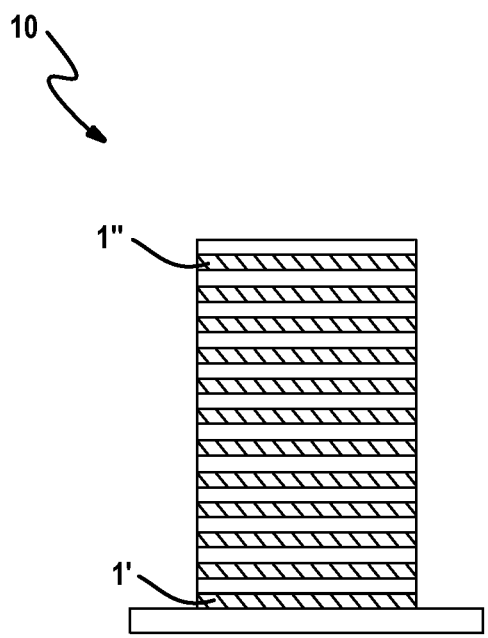

FIG. 5A shows electronic and nuclear resonant (magnetic) X-ray reflectivity curves measured for the magnetoelectronic device 10 shown in FIG. 7A.

Figure 5B:
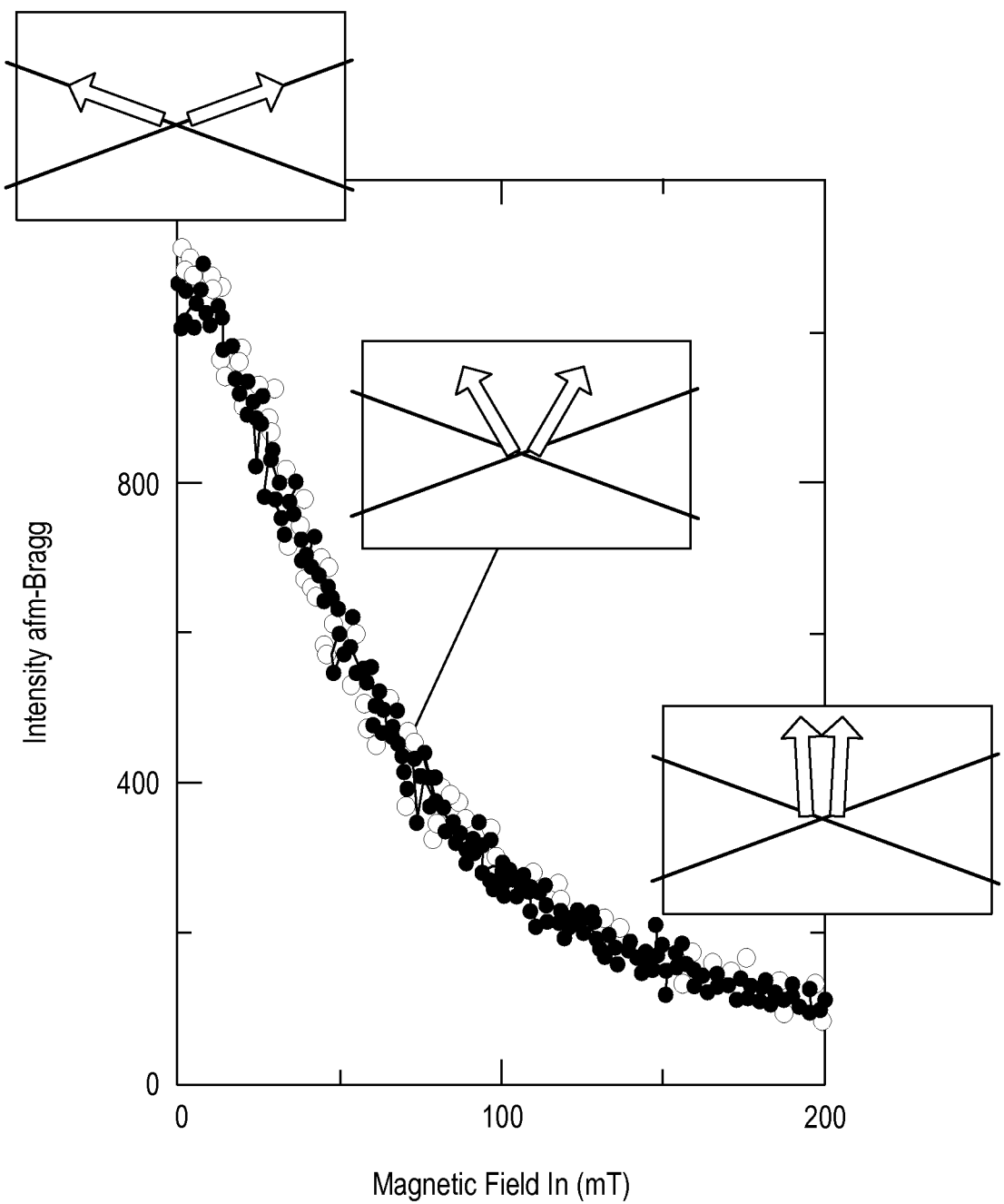

FIG. 5B shows the magnetic saturation behavior of the magnetoelectronic device in dependence of an external magnetic field.

FIG. 6A illustrates different combinations of magnetic moments of two adjacent iron layers of identical thickness separated by a non-magnetic layer and prepared in the same way as the multilayer structure of the magnetoelectronic device of FIG. 7A.

FIG. 6B shows for each of the combinations of FIG. 6A the direction of the external magnetic field used for measuring magnetization curves.

FIG. 6C illustrates schematic magnetization curves for each of the combinations of FIG. 6A.

FIG. 7A shows a magnetoelectronic device produced by the process illustrated in FIG. 4.

Figure 7B:
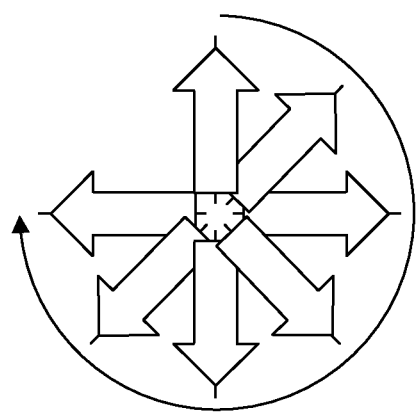

FIG. 7B illustrates the magnetic moments of the individual iron layers of one exemplary embodiment of the magnetoelectronic device of FIG. 7A.

Corresponding reference numerals indicate corresponding parts throughout the several views of the drawings.

DETAILED DESCRIPTION

Example embodiments will now be described more fully with reference to the accompanying drawings.

FIG. 1A schematically illustrates the deposition of a ferromagnetic iron layer 1 onto a chemically inert substrate 2 by means of oblique incidence sputter deposition of iron atoms in a side view and in a top view onto the iron layer 1 and the substrate 2. As can be seen in the side view, the direction 3 of the incident iron atoms is at a nonzero angle θ of, e.g., 80° with respect to the direction 4 perpendicular to the plane defined by the extension of the substrate 2 and of the iron layer 1. Further, in the illustrated example the deposition is effected at an azimuthal angle α of 0° with respect to a reference direction 5 extending parallel to the plane of extension or the direction of extension of the iron layer 1, i.e. the angle between the reference direction 5 and the projection of the direction of incidence 3 onto the plane defined by the extension of the substrate 2 and of the iron layer 1 is zero.

Due to this sputter deposition at a large oblique angle θ the deposited iron layer 1 exhibits uniaxial magnetic anisotropy with an uniaxial easy axis 6 perpendicular to the plane defined by the direction of incidence 3 and the projection of that direction onto the plane of extension of the substrate 2 and the iron layer 1. The uniaxial easy axis 6 corresponds to two possible directions 7 of the magnetic moment $M_r$ of the iron layer 1. One of the directions 7 can be selected for example by applying a small magnetic field during deposition.

Figure 1B:
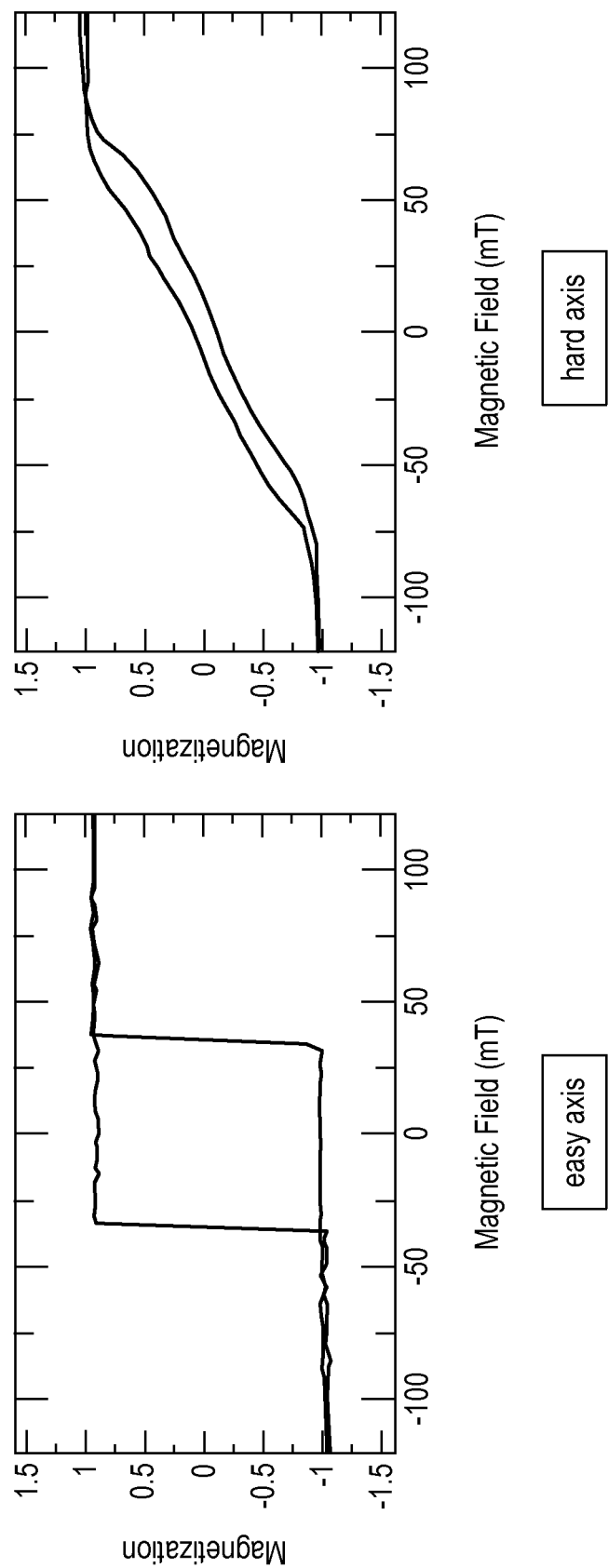
FIG. 1B shows schematic magnetization curves of the iron layer of FIG. 1a) for the easy axis and the hard axis, respectively.

FIG. 1B shows schematic magnetization curves of the iron layer 1 of FIG. 1A corresponding to the easy axis 6 and to the hard axis perpendicular thereto. Such magnetization curves can be measure by, e.g., MOKE.

Figure 2:
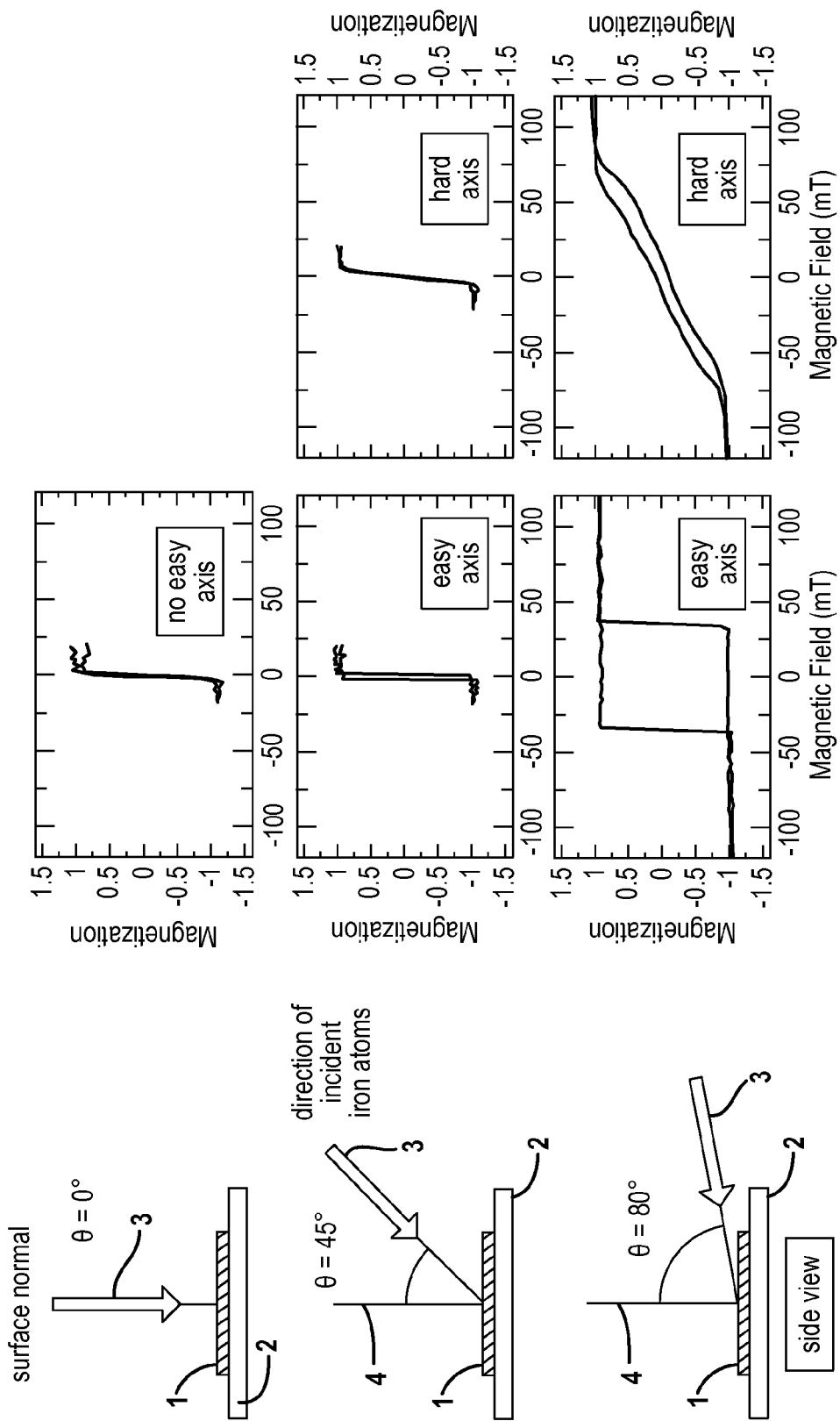
FIG. 2 shows schematic magnetization curves of the iron layer of FIG. 1a) for the three different deposition angles θ=0°, 45° and 80°.

In order to illustrate the dependence of the measured magnetization curves on the deposition angle θ, FIG. 2 shows the schematic magnetization curves for the free angles θ=0°, 45° 80°. For θ=0°, i.e. when oblique incidence deposition is not utilized, as common in the prior art, no uniaxial magnetic anisotropy is generated, so that no easy axis exists. Rather, the magnetization curve is then independent of the direction of measurement and the iron layer is soft magnetic. At an angle θ=45° a small increase in the magnetic anisotropy is present, and the easy axis is oriented perpendicularly with respect to the direction 3 of incidence of the iron atoms. This is also true for an angle θ=80°, but additionally the iron layer 1 is hardmagnetic.

Figure 3:
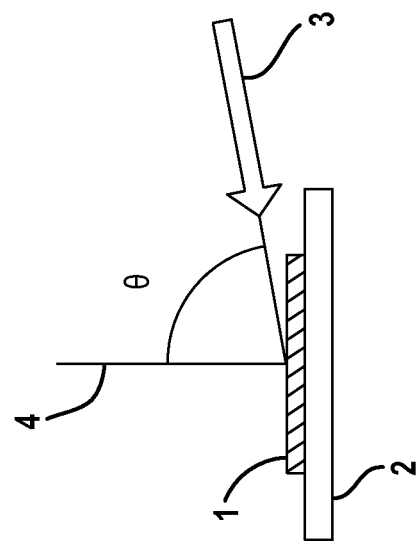
FIG. 3 illustrates for the iron layer of FIG. 1a) the dependence of the magnetic hardness on the angle θ of incidence of the iron atoms.
Figure 3:
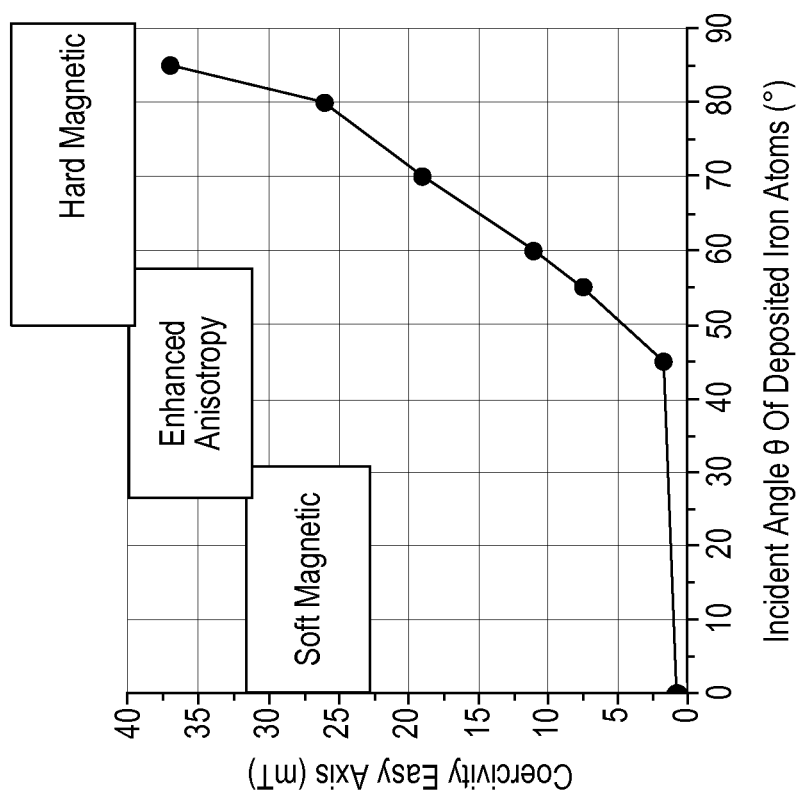

FIG. 3 illustrates for the iron layer 1 of FIG. 1A the dependence of the magnetic hardness, i.e. of the coercive field, on the angle θ of incidence of the iron atoms. It can be seen that it is possible to continuously adjust the magnetic hardness by suitably selecting the angle θ. Thus, for any magnetic material, softmagnetic and hardmagnetic layers can be selectively produced in a multilayer structure.

FIG. 4 schematically illustrates a process in which a multilayer structure comprising multiple ferromagnetic iron layers separated by non-magnetic intermediate layers is deposited onto an inert substrate, eventually resulting in a magnetoelectronic device. The first step of this process is essentially identical to FIG. 1A, i.e. a ferromagnetic iron layer 1 is deposited onto the substrate 2 by oblique incidence sputter deposition at a deposition angle θ of 80°. However, different from the example of FIG. 1A, an azimuthal angle α of +20° is utilized, resulting in a magnetic moment $M_1$ of the iron layer 1.

In the second step, subsequent to deposition of the first iron layer 1 directly onto the substrate, a non-magnetic carbon layer 8 is deposited onto the iron layer 1 at perpendicular incidence, i.e. at an angle θ of 0°. Then, a second ferromagnetic iron layer 1 is deposited onto the carbon layer 8 in the same manner as the first iron layer 1 was deposited onto the substrate 2, but utilizing an azimuthal angle of −20°, resulting in a magnetic moment $M_2$ of this iron layer 1 perpendicular to the magnetic moment $M_1$ of the first iron layer 1. After that, a second non-magnetic carbon layer 8 is deposited onto the second iron layer 1 at perpendicular incidence, i.e. at an angle θ of 0°. These steps are repeated several times, such as, e.g., six times, so that eventually a multilayer structure is created comprising an alternating sequence of twelve iron and twelve carbon layers 1, 8 on the substrate 2, wherein each two adjacent iron layers 1 have magnetizations oriented at a relative angle of 40°. The resulting multilayer structure, which constitutes a magnetoelectronic device 10, is illustrated in FIG. 7A and magnetically characterized in FIGS. 5A and 5B.

FIG. 5A schematically shows electronic (the top curve) and nuclear (the two bottom curves) resonant (magnetic) X-ray reflectivity curves measured for the magnetoelectronic device 10 shown in FIG. 7A. Details of a method with which the measurement of these curves can be carried out can be taken from the publication K. Schlage and R. Röhlsberger, "Nuclear resonant scattering of synchrotron radiation: Applications in magnetism of layered structures", J. Electron Spectrosc. Relat. Phenom (2013) (published online: http://dx.doi.org/10.1016/j.elspec.2013.02.005). It is also illustrated that the multilayer structure can assume two magnetic ground states, the second one of which is illustrated in FIG. 4. The ground states can be induced by a strong external magnetic field of e.g. 100 mT (see the left third of FIG. 5A and are characterized by a large opening angle of 140° of the two magnetic sublattices (low net magnetization) and by a small opening angle of 40°, respectively (high net magnetization), see the right third of FIG. 5A. The ground state 1 having the opening angle of 140° leads to a strong magnetic superstructure peak in the reflectivity curves at an angle of 0.25°.

FIG. 5B shows the magnetic saturation behavior of the magnetoelectronic device in dependence of an external magnetic field for the ground state 1 with an increasing external field (black symbols) having been applied along the resulting hard axis. The curve corresponds to the intensity of the magnetic superstructure peak. As illustrated in FIG. 5B, the monotone change of the intensity corresponds to the saturation behavior of the two sublattices due to rotation of the magnetization of the individual iron layers 1 out of their easy axis. The grey symbols illustrate the development of the intensity of the magnetic superstructure peak if the external magnetic field is subsequently decreased again. The curve represented by the grey symbols is essentially identical to the curve represented by the black symbols, so that no hysteretic effect is present.

FIG. 6B illustrates different combinations of imprinted magnetic anisotropy (characterized by the orientation of the easy axis and the magnetic hardness) of two adjacent iron layers 1 of identical thickness separated by a non-magnetic layer and—apart from the lower number of layers—prepared in the same way as the multilayer structure of the magnetoelectronic device 10 of FIG. 7A. The width of the arrows in FIG. 6A indicates the relative magnitude of the imprinted magnetic anisotropy, i.e. the magnetic hardness, wherein broader arrows represent a higher magnetic hardness than narrower arrows. They are realized by suitable choice of the deposition angles θ and the azimuthal angles α during deposition of the iron layers 1. FIG. 6B shows for each of the options of FIG. 6A the direction of the external magnetic field used for measuring magnetization curves, which are shown in FIG. 6C. As can be seen, by selectively choosing the deposition angles θ and the azimuthal angles α and, thereby, the magnetic hardnesses and the directions of magnetization of the individual iron layers 1, it is possible to selectively vary the characteristics of the magnetization curves in a wide range. For example, the magnetization curve can be made to exhibit a sharp jump (the top option), to exhibit a curved magnetic switching behavior (the middle option) or to exhibit an approximately linear relationship with the external magnetic field (the bottom option). For each option the left magnetization curve has been measured for a multilayer structure with a lower magnetic anisotropy than the right magnetization curve.

The change of the magnetization corresponding to the magnetization curves results in a corresponding change of the magnetoresistance. Therefore, it is possible to define a magnetization curve which leads to field dependent magnetoresistance characteristics suitable for a particular application. Then, the magnetic properties and corresponding manufacturing parameters of the iron layers 1 and the intermediate layers 8 can be determined which result in the desired magnetization curve. For example, if a magnetization curve having linear characteristics is desired for a particular application, the bottom combination of the magnetic moments is chosen. Due to the possibility to realize curved, sloping or nearly linear characteristics of the magnetization curve, it is, for example, possible to produce magnetoelectronic devices which are able to carry out quantitative measurements of the external magnetic field. In contrast to the prior art, the present invention enables a flexible adjustment or setting of the magnetic field strength or the range of magnetic field strength and of other characteristics of the magnetic field that can be measured qualitatively and quantitatively, and such adjustment is possible in an easy manner.

FIG. 7A shows a magnetoelectronic device 10 produced by the process illustrated in FIG. 4. FIG. 7B is a schematic top view of one exemplary embodiment of the device 10 in which the directions of the magnetic moments of the individual iron layers 1 are indicated. As can be seen, the direction of the magnetic moment varies gradually in the clockwise direction from the bottommost iron layer 1' to the topmost iron layer 1". This illustrates that it is possible to realize highly complex multilayer magnetization profiles.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of producing a multilayer magnetoelectronic device, the method comprising:
    depositing a multilayer structure including at least two ferromagnetic layers disposed one on top of the other and each having a magnetic anisotropy with a corresponding magnetic moment, wherein each two adjacent ferromagnetic layers of the at least two ferromagnetic layers are separated by a respective nonmagnetic layer, and wherein each of the ferromagnetic layers is deposited at a respective azimuthal angle with respect to a reference direction extending in the plane of extension of the respective ferromagnetic layer and at a nonzero angle of incidence with respect to a direction perpendicular to the plane of extension of the respective ferromagnetic layer, such that the respective ferromagnetic layer exhibits uniaxial magnetic anisotropy,
    (a) wherein a magnetization curve is specified for the magnetoelectronic device to be produced,
    (b) wherein, after having specified the magnetization curve, the number of ferromagnetic layers and, for each of the ferromagnetic layers, the magnetic moment and the magnetic hardness are determined in such a manner that the specified magnetization curve is obtained,
    (c) wherein subsequent to having determined the number of ferromagnetic layers and their magnetic moments and magnetic hardnesses, for each of the ferromagnetic layers individually a magnetic material, a thickness, an azimuthal angle and an angle of incidence are determined in such a manner that the determined magnetic moment and magnetic hardness of the respective ferromagnetic layer is obtained, and
    (d) wherein finally the step of depositing the multilayer structure is carried out using the determined material, thickness, azimuthal angle and angle of incidence for each of the ferromagnetic layers.

2. The method according to claim 1, wherein for at least one of the ferromagnetic layers the angle of incidence is greater than 45°.

3. The method according to claim 2, wherein for at least one of the ferromagnetic layers the angle of incidence is greater than 80°.

4. The method according to claim 1, wherein for each of the ferromagnetic layers the angle of incidence is chosen such that the respective ferromagnetic layer exhibits uniaxial magnetic anisotropy with the easy axis oriented perpendicularly with respect to a plane spanned by the direction of deposition and the projection of the direction of deposition onto the plane of extension of the respective ferromagnetic layer.

5. The method according to claim 1, wherein for each two adjacent ferromagnetic layers of the at least two ferromagnetic layers the azimuthal angles are different, such that the resulting magnetic moments have different directions.

6. The method according to claim 5, wherein for at least two adjacent ferromagnetic layers of the at least two ferromagnetic layers the difference in the azimuthal angles is between 1° and 89° or between 91° and 179°.

7. The method according to claim 1, wherein for each of the ferromagnetic layers the material is chosen from the group consisting of Fe, Co, Ni and alloys thereof.

8. The method according to claim 1, wherein each two adjacent ferromagnetic layers have the same material composition or each two adjacent ferromagnetic layers have different material compositions.

9. The method according to claim 1, further comprising:
    determining, for each of the nonmagnetic layers, the material and the thickness; and
    depositing the multilayer structure using the determined material and thickness for each of the nonmagnetic layers.

10. The method according to claim 1, wherein the deposition of the ferromagnetic layers and/or the deposition of the nonmagnetic layers is carried out by means of ion beam deposition or physical vapor deposition.

11. The method according to claim 1, wherein the multilayer structure is deposited onto a chemically inert, nonmagnetic substrate.

12. The method according to claim 11, wherein a seed layer is arranged between the substrate and the multilayer structure and the seed layer is in contact with both the substrate and one of the ferromagnetic layers.

13. The method according to claim 1, wherein the magnetoelectronic device is a magnetic field sensor.

* * * * *